United States Patent
Hashi

(10) Patent No.: US 8,476,810 B2
(45) Date of Patent: Jul. 2, 2013

(54) PIEZOELECTRIC DEVICE AND PIEZOELECTRIC DEVICE MANUFACTURING METHOD

(75) Inventor: Yukihiro Hashi, Shiojiri (JP)

(73) Assignee: Seiko Epson Corporation (JP)

( * ) Notice: Subject to any disclaimer, the term of this patent is extended or adjusted under 35 U.S.C. 154(b) by 281 days.

(21) Appl. No.: 12/972,644

(22) Filed: Dec. 20, 2010

(65) Prior Publication Data

US 2011/0163637 A1 Jul. 7, 2011

(30) Foreign Application Priority Data

Jan. 5, 2010 (JP) ................................. 2010-000429

(51) Int. Cl.
*H01L 41/053* (2006.01)
*H04R 17/00* (2006.01)

(52) U.S. Cl.
USPC .......................... 310/348; 310/370; 20/25.35

(58) Field of Classification Search
USPC ... 310/340, 349, 370; 257/414–416; 29/25.35
See application file for complete search history.

(56) References Cited

U.S. PATENT DOCUMENTS

| | | | | | |
|---|---|---|---|---|---|
| 4,288,284 A | * | 9/1981 | Kobayashi et al. | ............ | 216/97 |
| 4,293,986 A | * | 10/1981 | Kobayashi et al. | .......... | 29/25.35 |
| 4,362,961 A | * | 12/1982 | Gerber | .......................... | 310/370 |
| 4,652,787 A | * | 3/1987 | Zingg | ............................ | 310/344 |
| 7,518,291 B2 | | 4/2009 | Tanaya | | |
| 7,531,945 B2 | * | 5/2009 | Aratake | ........................ | 310/344 |
| 7,589,458 B2 | * | 9/2009 | Aratake | ........................ | 310/370 |
| 2001/0004125 A1 | * | 6/2001 | Schulthess et al. | ........... | 257/416 |
| 2008/0231145 A1 | | 9/2008 | Nagano et al. | | |
| 2010/0079962 A1 | | 4/2010 | Hashi | | |

FOREIGN PATENT DOCUMENTS

| | | | |
|---|---|---|---|
| JP | 2006-186464 A | * | 12/2004 |
| JP | 2006-094372 A | * | 4/2006 |
| JP | 2007-258918 | | 10/2007 |
| JP | 2008-271491 | | 11/2008 |
| JP | 2010-081308 | | 4/2010 |

* cited by examiner

*Primary Examiner* — Thomas Dougherty
(74) *Attorney, Agent, or Firm* — Harness, Dickey & Pierce, P.L.C.

(57) ABSTRACT

A piezoelectric device includes: a first substrate; a second substrate disposed opposed to the first substrate; a third substrate disposed between the first substrate and the second substrate, a part of the third substrate forming a piezoelectric oscillating piece, and another part of the third substrate forming a frame which surrounds the piezoelectric oscillating piece; a first metal film which joins the first substrate and the frame; a second metal film which joins the second substrate and the frame; and a resin portion provided at least at any one of positions between the first substrate and the first metal film, between the frame and the first metal film, between the second substrate and the second metal film, and between the frame and the second metal film.

5 Claims, 11 Drawing Sheets

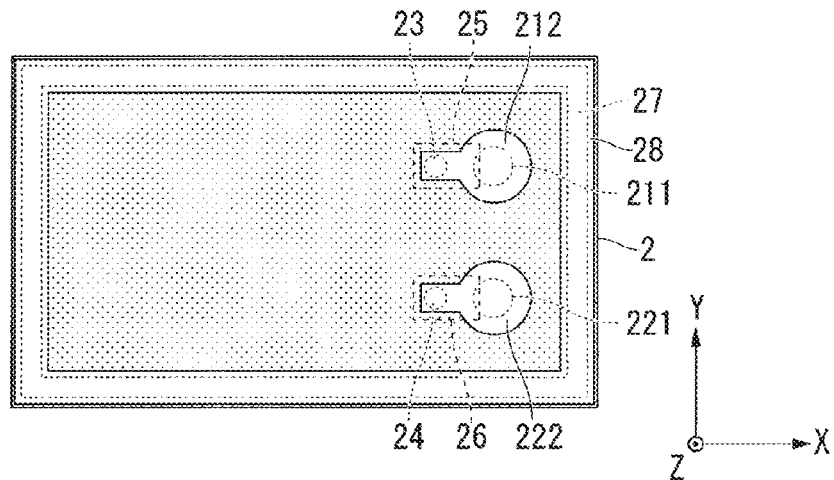
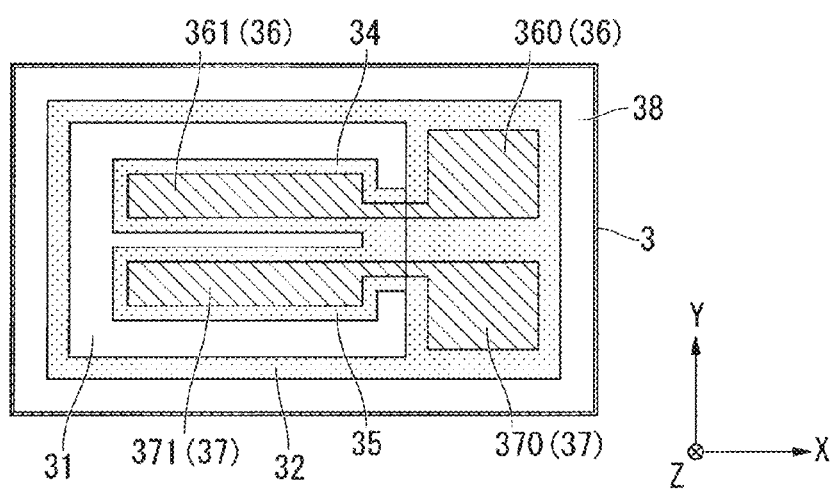
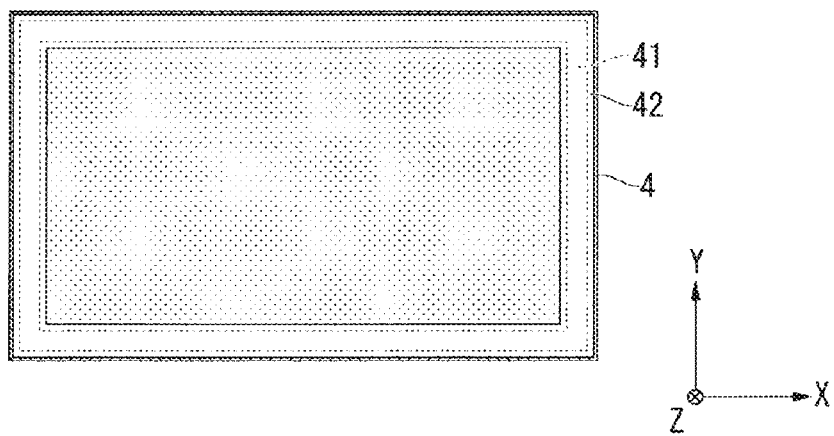

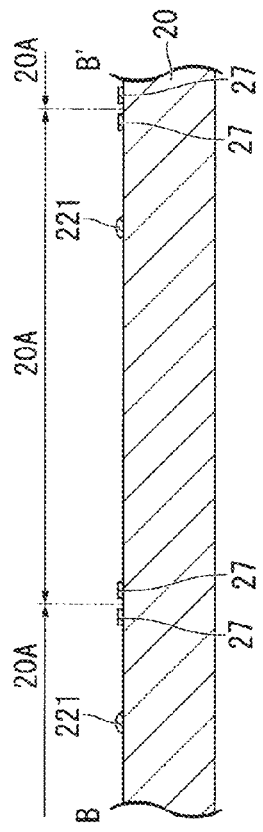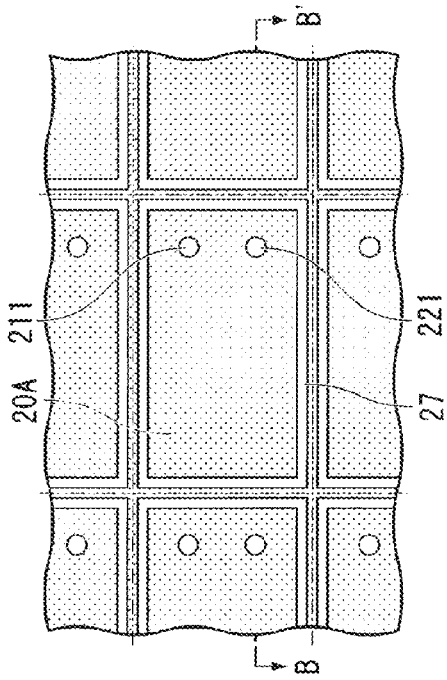
FIG. 5A
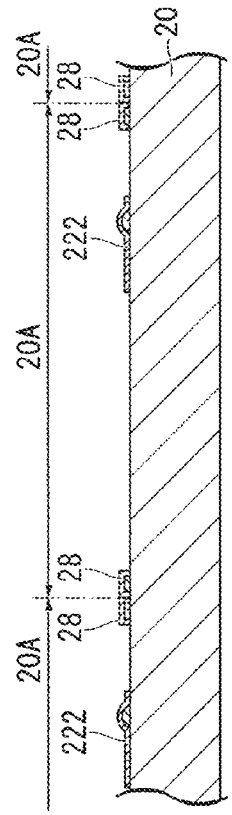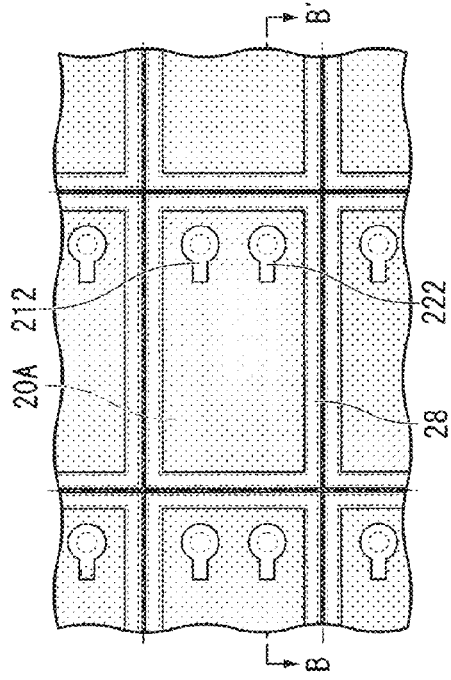
FIG. 5B

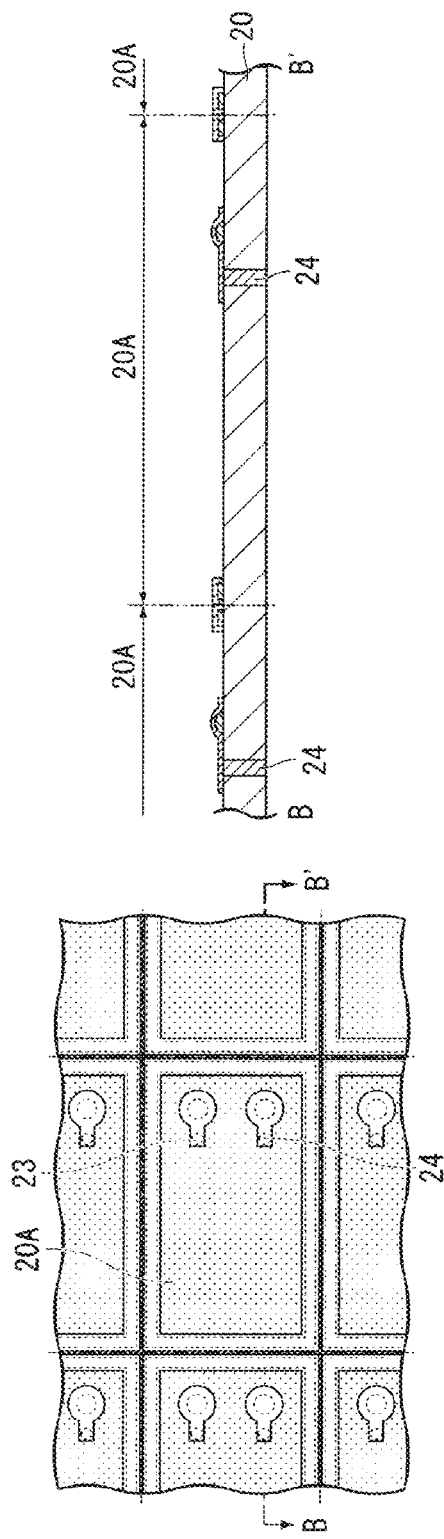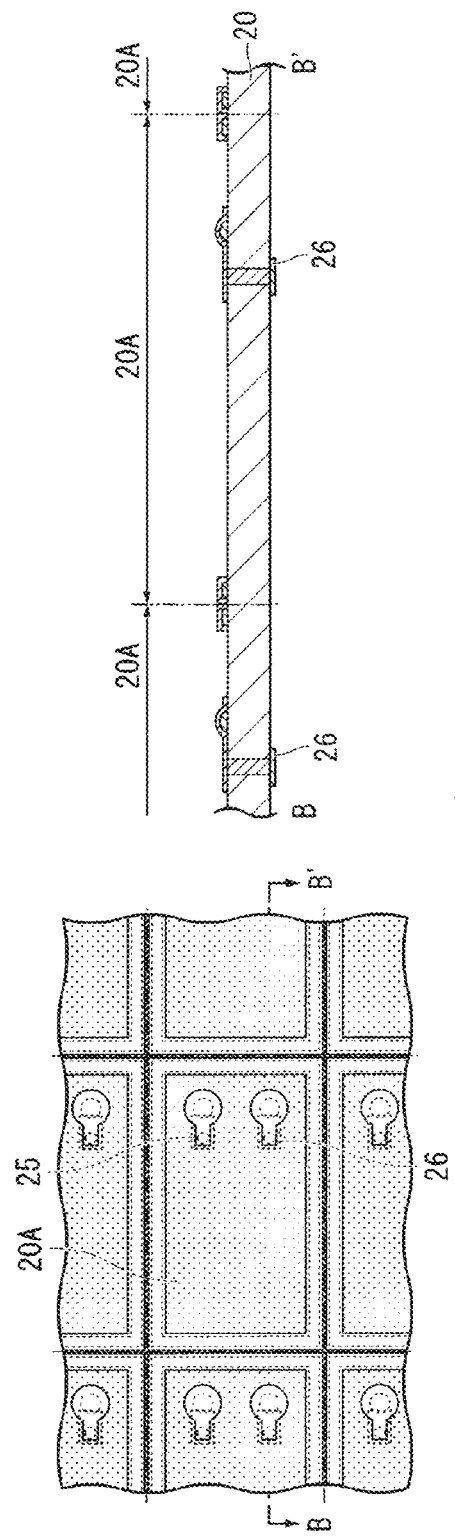
FIG. 6A
FIG. 6B

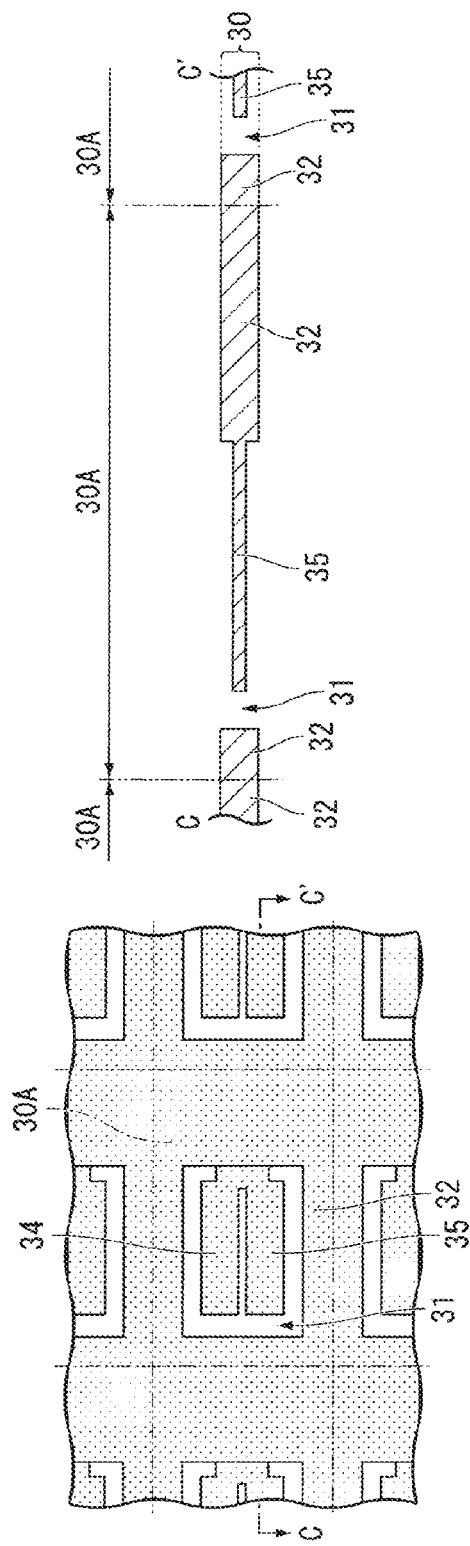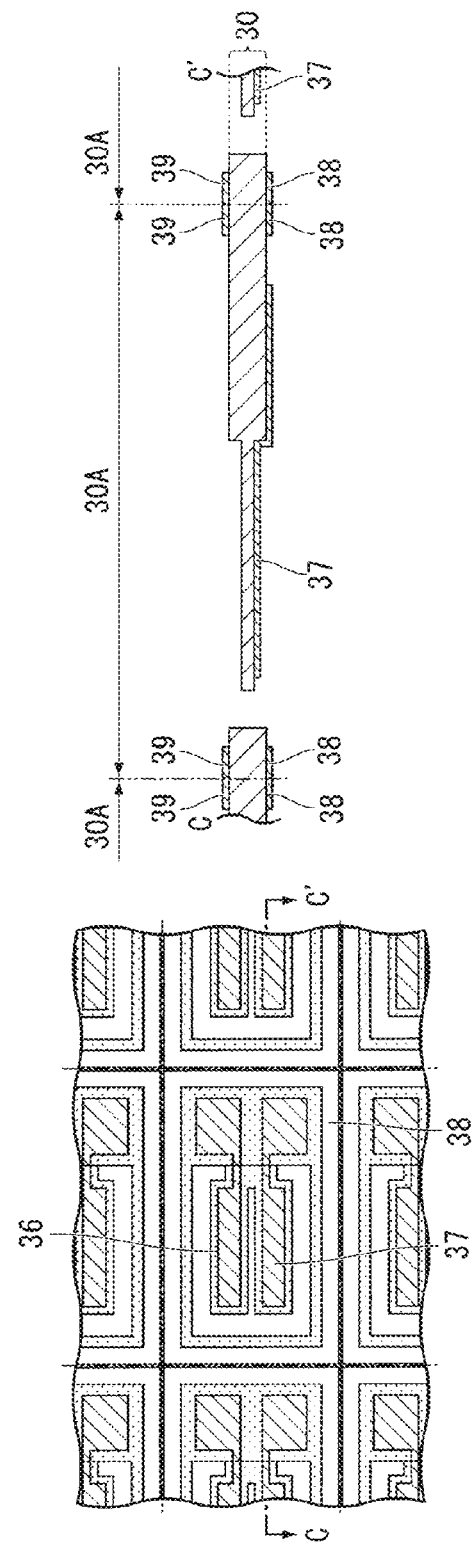
FIG. 7A
FIG. 7B

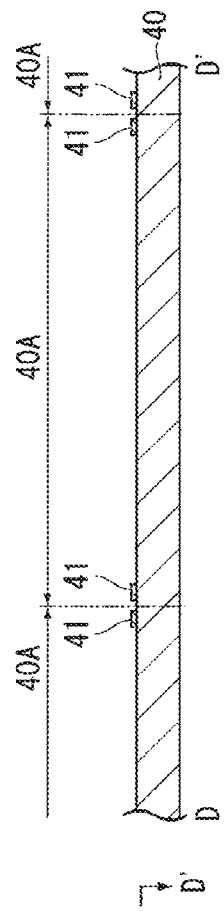 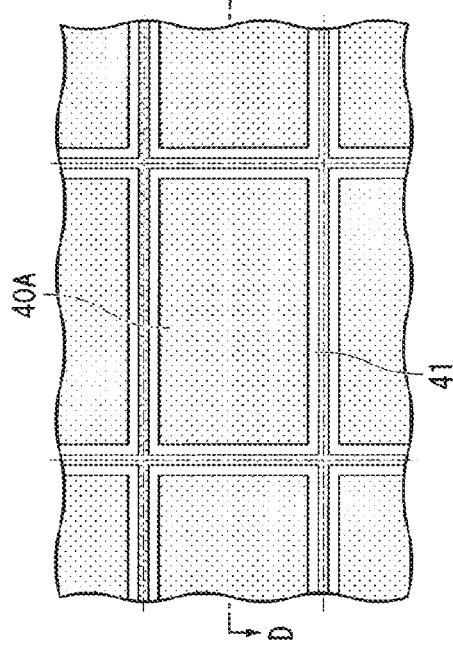
FIG. 8A
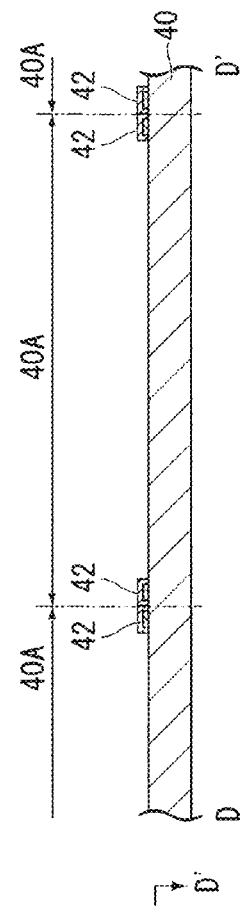 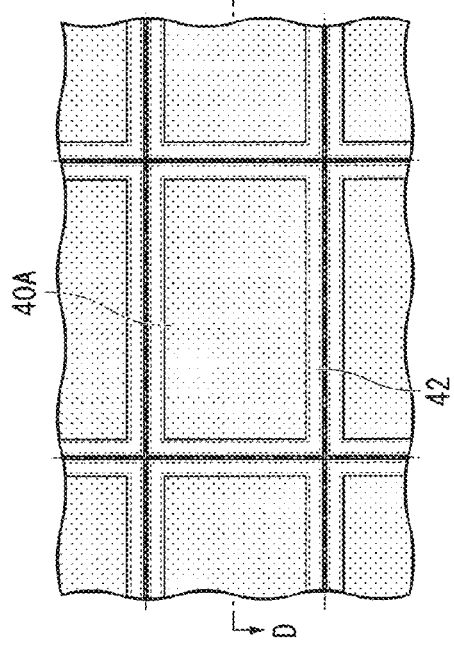
FIG. 8B

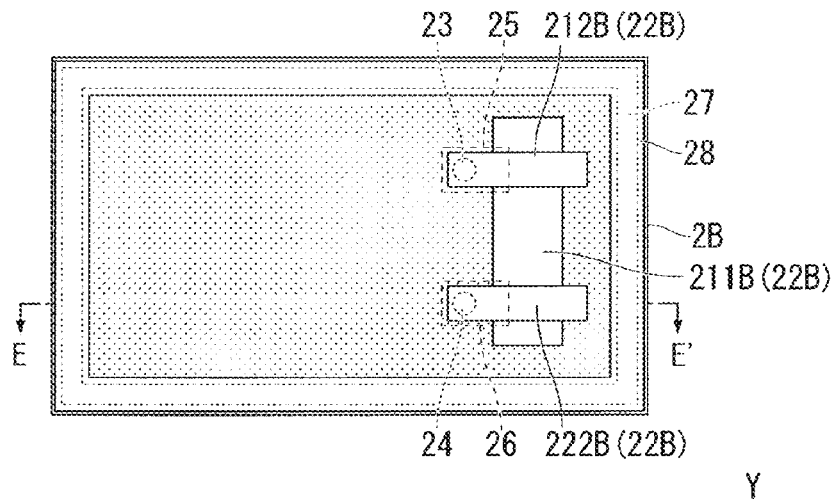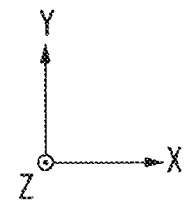
FIG.10A
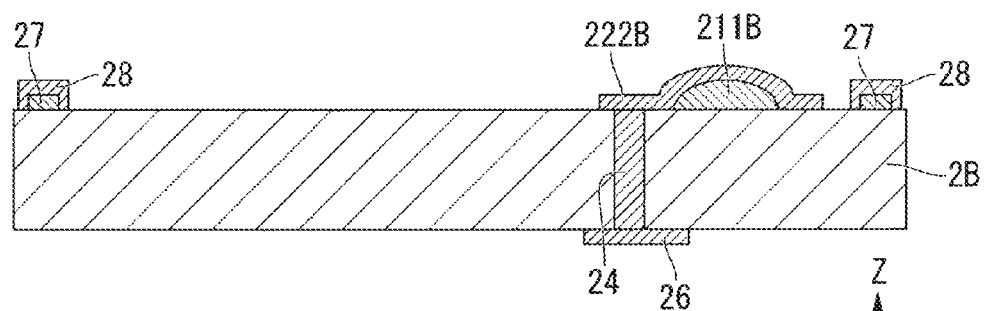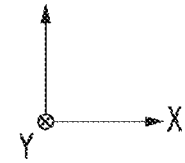
FIG.10B

PIEZOELECTRIC DEVICE AND PIEZOELECTRIC DEVICE MANUFACTURING METHOD

BACKGROUND

1. Technical Field

The present invention relates to a piezoelectric device and a piezoelectric device manufacturing method.

2. Related Art

Currently, a crystal oscillator is often included in an electronic apparatus such as a cellular phone. The crystal oscillator has a crystal oscillating piece sealed into a package. For manufacturing the crystal oscillator, a method which includes steps of forming an oscillator substrate containing the crystal oscillating piece and an outer frame surrounding the crystal oscillating piece as one piece body, and joining sealing substrates to both surfaces of the oscillator substrate has been proposed (for example, see JP-A-2007-258918 (Patent Document 1) and JP-A-2008-271491 (Patent Document 2)).

According to the methods disclosed in Patent Documents 1 and 2, the crystal oscillating piece is formed on each of a plurality of areas of an intermediate crystal wafer, and then a sealing crystal wafer is joined to each of the upper and lower sides of the intermediate crystal wafer. Subsequently, the plural areas are divided into individual pieces with the areas of the intermediate crystal wafer around the respective crystal oscillating pieces provided as the external frames to manufacture the plural crystal oscillators at a time. According to this method, the productivity considerably increases compared with that of a method which mounts the crystal oscillating pieces by steps separated for each crystal oscillator.

According to the method shown in Patent Document 1, the intermediate crystal wafer and the sealing crystal wafers are joined to each other by surface-activating junction. According to the method shown in Patent Document 2, metal films for joining the intermediate crystal wafer and the sealing crystal wafers are formed. In this method, a metal paste sealing agent is applied between the metal films, and then is burned to join the intermediate crystal wafer and the sealing crystal wafers. When the wafers are connected almost without using organic solvent as in this method, deterioration of the crystal oscillating piece and lowering of oscillation characteristics caused by gas generated from the organic solvent can be reduced.

While high-quality crystal oscillators can be manufactured with high efficiency according to the technologies disclosed in Patent Documents 1 and 2, the following problems still remain as points to be improved.

According to the methods shown in Patent Documents 1 and 2, the intermediate crystal wafer is joined by surface-activating junction or metal junction. Thus, the intermediate crystal wafer containing the crystal oscillating pieces are rigidly fixed. In this case, an impact force given from the outside is easily transmitted to the crystal oscillating pieces, and thus the shock resistance of the crystal oscillators lowers. Moreover, the oscillation of the crystal oscillating pieces is easily diffused to the sealing crystal wafers, and thus the oscillation characteristics such as the Q factor lower in some cases.

SUMMARY

An advantage of some aspects of the invention is to provide a piezoelectric oscillator having excellent shock resistance and oscillation characteristics and a method of manufacturing the piezoelectric oscillator.

According to an aspect of the invention, there is provided a piezoelectric device including: a first substrate; a second substrate disposed opposed to the first substrate; a third substrate disposed between the first substrate and the second substrate, a part of the third substrate forming a piezoelectric oscillating piece, and another part of the third substrate forming a frame which surrounds the piezoelectric oscillating piece; a first metal film which joins the first substrate and the frame; a second metal film which joins the second substrate and the frame; and a resin portion provided at least at any one of positions between the first substrate and the first metal film, between the frame and the first metal film, between the second substrate and the second metal film, and between the frame and the second metal film.

According to this structure, an external force given to the first substrate or the second substrate is reduced by the resin portion, and thus is not easily transmitted to the third substrate containing the piezoelectric oscillating piece. Thus, the shock resistance of the piezoelectric device improves. Moreover, the oscillation of the piezoelectric oscillating piece not easily transmitted to the first substrate and the second substrate is not easily diffused. Thus, the oscillation characteristics such as the Q factor of the piezoelectric device improve. Since the first substrate, the second substrate, and the third substrate are joined to each other by the first metal film and the second metal film, the necessity of connecting these substrates by using adhesives or the like can be reduced. Thus, lowering of the oscillation characteristics caused by gas from organic solvent of the adhesive can be avoided. Accordingly, the piezoelectric device according to this aspect of the invention obtains excellent shock resistance and oscillation characteristics.

The piezoelectric device according to this aspect of the invention may have the following structures as typical examples.

A bump electrode which contains a resin projection projecting toward the third substrate and a conductive film covering the resin projection may be provided on the first substrate. An electrode of the piezoelectric oscillating piece may contact the conductive film and have conduction with the conductive film.

According to this structure, the resin projection deforms in accordance with the oscillation of the piezoelectric oscillating piece. Thus, electric signals can be transmitted to the piezoelectric oscillating piece without disturbance to the oscillation of the piezoelectric oscillating piece. Moreover, the structure not rigidly fixing the electrode can reduce the effect of the external impact via the electrode portion. Since the resin projection presses the conductive film against the electrode of the piezoelectric oscillating piece in accordance with the oscillation of the piezoelectric oscillating piece, the connection reliability of the electrode of the piezoelectric oscillating piece increases. In addition, since the electrode of the piezoelectric oscillating piece contacts the conductive film and has conduction with the conductive film, the necessity of using a conductive adhesive for conduction can be reduced. Thus, the adverse effect of gas produced from organic solvent of the adhesive can be eliminated.

The first metal film may be continuously formed throughout the frame in the peripheral direction of the frame. A through electrode may be provided on the area of the first substrate surrounded by the frame in such a manner as to penetrate through the first substrate. The through electrode may be electrically connected with the electrode of the piezoelectric oscillating piece.

According to this structure, the first metal film is continuously formed throughout the frame in the peripheral direction of the frame. Thus, the airtightness of the space surrounded by the first substrate, the frame, and the second substrate can be raised, and preferable oscillation characteristics of the piezoelectric oscillating piece can be maintained. Moreover, the electrode of the piezoelectric oscillating piece can be electrically connected with the outside via the through electrode penetrating through the first substrate. Thus, the electric signals can be easily transmitted to the piezoelectric oscillating piece. In case of a structure which connects the electrode of the piezoelectric oscillating piece with the outside along the route between the first substrate and the third substrate, for example, wires need to cross the first metal film. In this case, the wiring structure may become complicated. According to the structure of this aspect of the invention, however, the piezoelectric oscillating piece can be sealed with high airtightness, and complication of the wiring structure can be avoided.

The entire part of the resin portion may be covered by the first metal film or the second metal film.

According to this structure, gas generated from the resin portion can be sealed by the first metal film or the second metal film. Thus, lowering of the oscillation characteristics caused by gas can be prevented.

According to another aspect of the invention, there is provided a piezoelectric device manufacturing method for manufacturing a piezoelectric device which includes a first substrate, a second substrate disposed opposed to the first substrate and joined to the first substrate with a third substrate interposed between the first and second substrates, a part of the third substrate forming a piezoelectric oscillating piece, and another part of the third substrate forming a frame which surrounds and supports the piezoelectric oscillating piece. The method includes: forming a first metal film disposed between the first substrate and the frame; forming a second metal film disposed between the second substrate and the frame; forming a resin portion provided at least at any one of positions between the first substrate and the first metal film, between the frame and the first metal film, between the second substrate and the second metal film, and between the frame and the second metal film by using resin material; joining the first substrate and the frame by the first metal film; and joining the second substrate and the frame by the second metal film.

According to this method, the frame is joined to the first substrate and the second substrate via the resin portion. Thus, an impact force transmitted to the piezoelectric oscillating piece from the first substrate or the second substrate via the frame in the manufactured piezoelectric device can be reduced. Moreover, diffusion of the oscillation of the piezoelectric oscillating piece to the first substrate and the second substrate can be reduced. In addition, the first substrate and the frame are joined by the first metal film, and the second substrate and the frame are joined by the second metal film. Thus, the necessity for connection by using adhesives can be lowered, and thus adverse effects of gas generated from organic solvent can be decreased or avoided. Accordingly, a piezoelectric device having excellent shock resistance and oscillation characteristics can be manufactured according to this aspect of the invention.

The piezoelectric device manufacturing method of this aspect of the invention may be configured as described below as typical examples.

The piezoelectric device manufacturing method may further include: forming at least the one resin portion on the surface of the first substrate on the side joined to the frame, and also forming a resin projection on the area of the surface corresponding to the position of an electrode of the piezoelectric oscillating piece; and forming a conductive film electrically connected with the electrode of the piezoelectric oscillating piece on the resin projection to produce a bump electrode containing the resin projection and the conductive film.

According to this method, the resin portion and the resin projection are formed by the same process. Accordingly, the number of the manufacturing steps can be reduced, and thus the piezoelectric device having preferable characteristics can be efficiently manufactured.

The resin projection may be formed in such a manner as to project from the surface where the resin portion is formed by a length larger than the length of projection of the resin portion from the surface in the process for forming the resin projection. The gap between the first substrate and the third substrate may be controlled by the resin portion in such a condition that the conductive film can be pressed against the electrode of the piezoelectric oscillating piece by the resin projection for contact between the conductive film and the electrode in the process for joining the first substrate and the frame.

According to this method, the resin projection projects from the surface of the first substrate on the side joined to the frame by a length larger than the length of projection of the resin portion from the surface. Thus, the resin projection is compressed and deformed between the first substrate and the frame. Since the conductive film is pressed against the electrode of the piezoelectric oscillating piece by resiliency of the resin projection, the conductive film can be brought into contact with the electrode of the piezoelectric oscillating piece in accordance with the oscillation of the piezoelectric oscillating piece. Accordingly, the piezoelectric device having preferable connection reliability between the electrode of the piezoelectric oscillating piece and the conductive film can be manufactured. Moreover, the necessity of using a conductive adhesive for conduction with the electrode of the piezoelectric oscillating piece can be reduced.

BRIEF DESCRIPTION OF THE DRAWINGS

The invention will be described with reference to the accompanying drawings, wherein like numbers reference like elements.

FIG. 3A is a plan view of a base substrate.

FIG. 3B is a plan view of an oscillator substrate.

FIG. 3C is a plan view of a cap substrate.

FIGS. 5A and 5B schematically illustrate process steps for the first wafer.

FIGS. 6A and 6B illustrate steps continued from FIG. 5B.

FIGS. 7A and 7B schematically illustrate process steps for the second wafer.

FIGS. 8A and 8B schematically illustrate process steps for the third wafer.

FIGS. 10A and 10B are a plan view and a cross-sectional view of a base substrate in a modified example, respectively.

DESCRIPTION OF EXEMPLARY EMBODIMENTS

Figure 1:
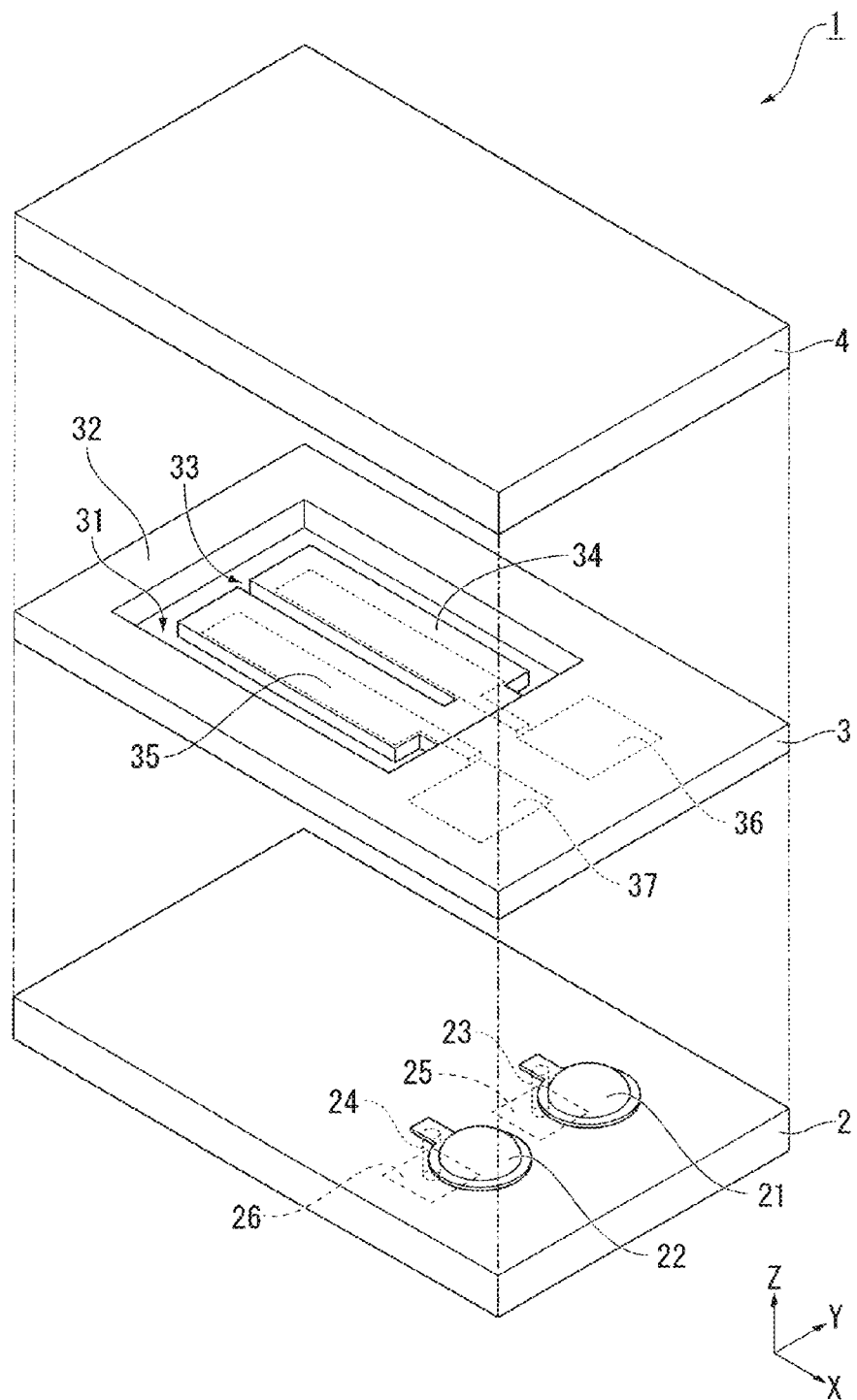
FIG. 1 is a perspective view schematically illustrating the general structure of a disassembled piezoelectric device according to a first embodiment.

Exemplary embodiments according to the invention are hereinafter described with reference to the drawings. In the drawings referred to in the following description, the sizes and reduction scales of the structures shown in the figures are different from the actual sizes and reduction scales for easy understanding of the characteristic parts in some cases. The same reference numbers are given to similar components and parts in the respective embodiments, and the detailed explanation of those is not repeated in some cases.

First Embodiment

Figure 2A:
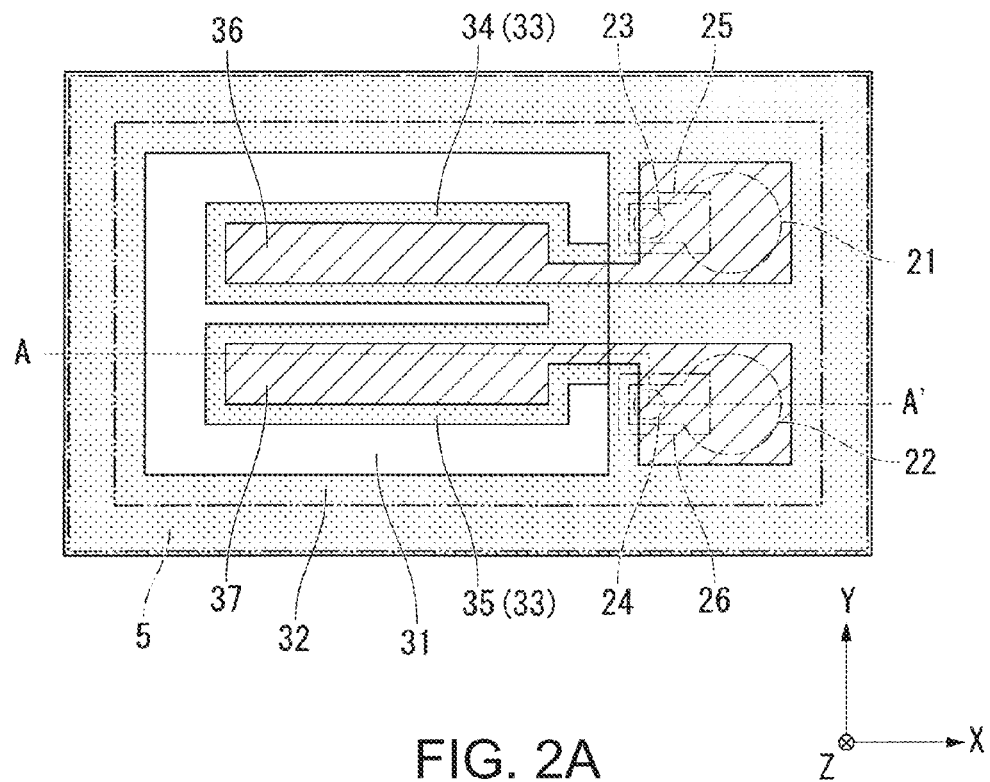
FIG. 2A is a plan view of the piezoelectric device according to the first embodiment.
Figure 2B:
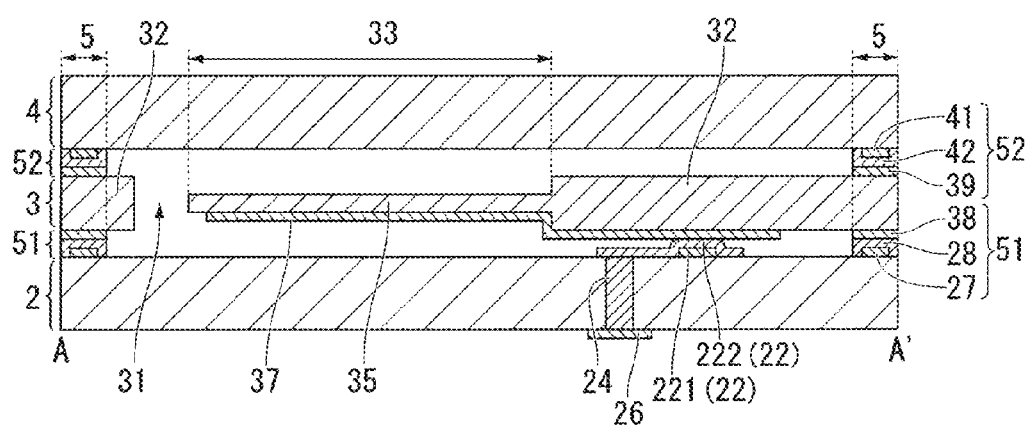
FIG. 2B is a cross-sectional view of the piezoelectric device according to the first embodiment.

FIG. 1 is a perspective view schematically illustrating the general structure of a disassembled piezoelectric device 1 according to a first embodiment. FIG. 2A is a plan view of the piezoelectric device 1. FIG. 2B is a cross-sectional view taken along a line A-A' in FIG. 2A. FIG. 3A is a plan view of a base substrate 2 as viewed from one main surface of the base substrate 2. FIG. 3B is a plan view of an oscillator substrate 3 as viewed from the surface of the oscillator substrate 3 opposed to the base substrate 2. FIG. 3C is a plan view of a cap substrate 4 as viewed from the surface of the cap substrate 4 opposed to the oscillator substrate 3.

As illustrated in FIGS. 1, 2A and 2B, and 3A through 3C, the piezoelectric device 1 includes the base substrate 2 as a first substrate, the oscillator substrate 3 as a third substrate, and the cap substrate 4 as a second substrate. The oscillator substrate 3 is sandwiched between the base substrate 2 and the cap substrate 4. The oscillator substrate 3 is joined to the base substrate 2 by a first junction unit 51 provided on a periphery 5 of the piezoelectric device 1. The cap substrate 4 is joined to the base substrate 2 by a second junction unit 52 provided on the periphery 5. The periphery 5 is the area which overlaps with a part of a frame 32 (described later) of the oscillator substrate 3 in the thickness direction of the piezoelectric device 1 (Z direction).

According to the XYZ rectangular coordinate system shown in FIG. 1, the X direction and the Y direction correspond to directions extending along the main surface of the base substrate 2, and the Z direction corresponds to the normal line direction of the main surface of the base substrate 2. In this embodiment, the shape of the main surface of the base substrate 2 is substantially rectangular in the plan view. The longer side of the base substrate 2 extends in the X direction, and the shorter side of the base substrate 2 extends in the Y direction. The base substrate 2, the oscillator substrate 3, and the cap substrate 4 are laminated in the Z axis direction and joined to each other.

The base substrate 2 is a plate component made of crystal, glass, silicon or the like. Bump electrodes 21 and 22 are provided on one of the main surfaces (referred to as front surface) of the base substrate 2. Through electrodes 23 and 24 penetrate through the base substrate 2. Back surface terminals 25 and 26 are provided on the other main surface (referred to as back surface) of the base substrate 2.

The bump electrode 21 includes a core (resin projection) 211, and a conductive film 212 covering the core 211. Examples of the material of the core 211 involve polyimide resin, acrylic resin, phenol resin, silicon resin, silicon modified polyimide resin, and epoxy resin. In this embodiment, the entire area of the core 211 is covered with the conductive film 212. The conductive film 212 provided on the core 211 extends onto the front surface of the base substrate 2. The conductive film 212 is made of conductive material selected according to the forming method, the design values of the electric characteristics and the like. The conductive film 212 is constituted by a single or a plurality of conductive layers. The conductive film 212 in this embodiment is constituted by dual conductive layers containing a gold layer laminated on a titanium layer. The part of the conductive film 212 extended to the surface of the base substrate 2 contacts the through electrode 23 and has conduction with the through electrode 23. The through electrode 23 contacting the back surface terminal 25 has conduction with the back surface terminal 25.

The bump electrode 22 has a structure similar to that of the bump electrode 21, and includes a core (resin projection) 221 and a conductive film 222. The conductive film 222 contacting the through electrode 24 has conduction with the through electrode 24. The through electrode 24 contacting the back surface terminal 26 has conduction with the back surface terminal 26. The back surface terminals 25 and 26 are electrically connected with a driving circuit for driving the piezoelectric device 1. The driving circuit may be contained in an IC chip, a circuit board or the like separated from the piezoelectric device 1, or formed on the back surface of the base substrate 2.

A first resin portion (resin portion) 27 and a first junction layer 28 are provided on the area of the base substrate 2 corresponding to the periphery 5. Both the first resin portion 27 and the first junction layer 28 are disposed along the outer periphery of the base substrate 2 to annularly surround the bump electrodes 21 and 22. The first junction layer 28 is formed in such a manner as to cover the entire part of the first resin portion 27. The first junction layer 28 is made of metal or alloy, and has a single or a plurality of metal layers. The first junction layer in this embodiment is made of gold-tin alloy. The first resin portion 27 is made of resin material more easily deformable than the material of the first junction layer 28. The material of the first resin portion 27 is selected from the resin materials listed above as the materials of the core 211 or other appropriate materials. The first resin portion 27 in this embodiment is made of the same resin material as that of the core 211.

The oscillator substrate 3 is a plate component made of piezoelectric material (such as crystal). The oscillator substrate 3 has an opening 31. The portion of the oscillator substrate 3 surrounding the opening 31 corresponds to the frame 32, and the portion of the oscillator substrate 3 surrounded by the opening 31 corresponds to a piezoelectric oscillating piece 33. The piezoelectric oscillating piece 33 is continuous from a part of the frame 32 and cantilevered by the frame 32. The piezoelectric oscillating piece 33 in this embodiment is produced as a component continuous from the frame 32 by forming the opening on the substrate. However, the piezoelectric oscillator 33 may be formed separately from the frame 32 and then connected to the frame 32. The piezoelectric oscillating piece 33 is hermetically sealed in a space surrounded by the base substrate 2, the cap substrate 4, and the frame 32.

According to this embodiment, the shape of the frame 32 is substantially rectangular frame-shaped in the plan view, and the shape of the piezoelectric oscillating piece 33 is substantially U-shaped in the plan view. The opening 31 is formed at a position shifted toward one side (−X direction) in the direction along the longer side of the oscillator substrate 3. The piezoelectric oscillating piece 33 is tuning-fork-shaped, and has a pair of arms 34 and 35. The piezoelectric oscillating piece 33 has a smaller thickness than that of the frame 32. The surface of the piezoelectric oscillating piece 33 is recessed from the surface of the frame 32 on both surfaces of the oscillator substrate 3, and produces a level difference from the surface of the frame 32.

Exciting electrodes 36 and 37 are provided on the surface of the oscillator substrate 3 opposed to the base substrate 2. The exiting electrode 36 includes a terminal portion 360 and a wiring portion 361. The exiting electrode 37 includes a terminal portion 370 and a wiring portion 371. The terminal portions 360 and 370 are disposed on the surface of the frame 32 on the +X side of the opening 31, and are arranged in a line in the Y direction. The terminal portion 360 contacting the conductive film 212 of the bump electrode 21 has conduction with the conductive film 212. The wiring portion 361 extends in the −X direction from the terminal portion 360 and covers a part of the surface of the arm 34. The terminal portion 370 contacts the conductive film 222 of the bump electrode 22. The wiring portion 371 extends in the −X direction from the terminal portion 370 and covers a part of the surface of the arm 35.

A second junction layer 38 and a third junction layer 39 are provided on the area of the oscillator substrate 3 corresponding to the periphery 5. Each of the second junction layer 38 and the third junction layer 39 is made of simple substance metal or alloy, and has a single or a plurality of metal layers. Each of the second junction layer 38 and the third junction layer 39 in this embodiment is made of gold-tin alloy. The second junction layer 38 and the third junction layer 39 are disposed along the outer periphery of the base substrate 2. The second junction layer 38 is formed on the surface of the oscillator substrate 3 opposed to the base substrate 2 in such a manner as to overlap with the first junction layer 28 in the plan view. The third junction layer 39 is formed on the surface of the oscillator substrate 3 opposed to the cap substrate 4.

The second junction layer 38 is joined to the area of the first junction layer 28 overlapping with the first resin portion 27 in the plan view. Examples of the method for connecting the first junction layer 28 and the second junction layer 38 involve soldering, surface-activating junction, and diffusing junction. In this embodiment, the first junction layer 28 and the second junction layer 38 are connected by soldering to form a first metal film, and the first metal film and the first resin portion 27 constitute the first junction unit 51. The gap between the base substrate 2 and the oscillator substrate 3 is controlled by the first junction unit 51. This gap is determined such that resiliency can be produced by the compression of the cores 211 and 221. The conductive films 212 and 222 are pressed against the exiting electrodes 36 and 37 by the resiliency of the cores 211 and 221 to come into tight contact with the exciting electrodes 36 and 37 and have conduction therewith.

The cap substrate 4 is a plate component made of crystal, glass, or silicon, for example. A second resin portion (resin portion) 41 and a fourth junction layer 42 are provided on the area of the cap substrate 4 corresponding to the periphery 5. Each of the second resin portion 41 and the fourth junction layer 42 is disposed along the outer periphery of the cap substrate 4. The fourth junction layer 42 covers the entire area of the second resin portion 41.

The fourth junction layer 42 is made of simple substance metal or alloy, and contains a single or a plurality of metal layers. The fourth junction layer 42 in this embodiment is made of gold-tin alloy. The second resin portion 41 is made of resin material more easily deformable than the material of the fourth junction layer 42. The material of the second resin portion 41 is selected from the resin materials listed above as the material examples of the core 211 or other appropriate materials. The second resin portion 41 in this embodiment is made of the same resin material as the materials of the cores 211 and 221 and the first resin portion 27.

The fourth junction layer 42 is joined to the area of the third junction layer 39 overlapping with the second resin portion 41 in the plan view. According to this embodiment, the third junction layer 39 and the fourth junction layer 42 are connected with each other by soldering to form a second metal film. The second metal film and the second resin portion 41 constitute the second junction unit 52.

When an electric signal is supplied from the driving circuit to the piezoelectric device 1 having this structure, voltage is applied to the exciting electrodes 36 and 37 via the back surface terminals 25 and 26 and the through electrodes 23 and 24. This voltage oscillates the piezoelectric oscillating piece 33 at a highly accurate frequency corresponding to the natural frequency.

When an external force acts on the base substrate 2 or the cap substrate 4, the first resin portion 27 and the second resin portion 41 reduce this external force. As a result, the possibility that the piezoelectric oscillating piece 33 is damaged by the external force can be considerably decreased. Moreover, the external force is not easily transmitted to the oscillator substrate 3, and thus the oscillation of the piezoelectric oscillating piece 33 is not easily affected by the external force. Accordingly, the piezoelectric oscillating piece 33 can oscillate at a highly accurate frequency, thereby offering preferable oscillation characteristics of the piezoelectric device 1.

The first resin portion 27 and the second resin portion 41 deform according to the oscillation of the piezoelectric oscillating piece 33. Compared with a structure which includes no resin portion, the oscillator substrate 3 can be gently supported in such a manner as not to prevent generation of the oscillation of the piezoelectric oscillating piece 33. In this case, the oscillation of the piezoelectric oscillating piece 33 is not easily diffused to the base substrate 2 and the cap substrate 4. Thus, the Q factor of the piezoelectric device 1 can improve.

There is a possibility that the gap between the base substrate 2 and the oscillator substrate 3 changes by the deformations of the first resin portion 27 and the second resin portion 41. However, since the conductive films 212 and 222 pressed against the exciting electrodes 36 and 37 by the resiliency of the cores 211 and 221 tightly contact the exciting electrodes 36 and 37, the change of the gap can be absorbed by the deformations of the cores 211 and 221. Thus, lowering of the connection reliability between the exciting electrodes 36 and 37 and the bump electrodes 21 and 22 can be prevented even when the gap changes.

Moreover, the connection between the base substrate 2 and the oscillator substrate 3 and the connection between the oscillator substrate 3 and the cap substrate 4 are achieved by soldering or other methods, the necessity of using adhesives or the like containing organic solvent for connection between the substrates is reduced. The gap between the base substrate 2 and the oscillator substrate 3 is controlled by the first junction unit 51 such that the conduction between the exciting electrodes 36 and 37 and the bump electrodes 21 and 22 can be produced by the connecting force of the first junction unit 51. Thus, the necessity of using conductive adhesives containing organic solvent for electric connection between the electrodes can be reduced. Accordingly, lowering of the oscillation characteristics caused by volatile gas can be avoided by decreasing the amount of volatile gas produced by organic solvent.

There is a possibility that gas is produced from the cores 211 and 221, though the amount of the gas from the cores 211 and 221 is smaller than the amount of the gas produced from the organic solvent of the adhesives. According to this embodiment, however, the entire parts of the cores 211 and 221 are covered with the conductive films 212 and 222, and the gas produced from the cores 211 and 221 is closed between the conductive films 212 and 222 and the base substrate 2. Accordingly, the gas produced from the cores 211 and 221 and flowing into the space into which the piezoelectric oscillating piece 33 is sealed can be considerably reduced, and thus lowering of the oscillation characteristics caused by the gas can be prevented.

Second Embodiment

A piezoelectric device manufacturing method according to a second embodiment of the invention is now described based on the structure of the piezoelectric device 1 according to the first embodiment.

Figure 4A:
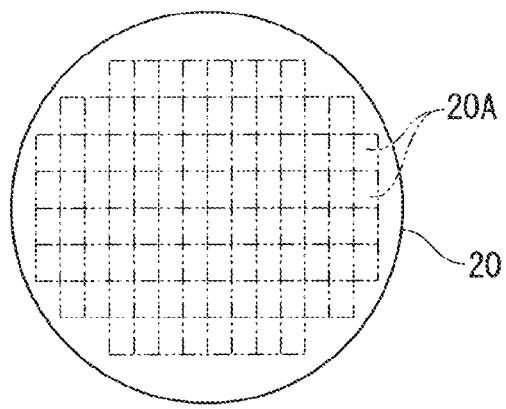
FIGS. 4A through 4C are plan views of first through third wafers, respectively.
Figure 4B:
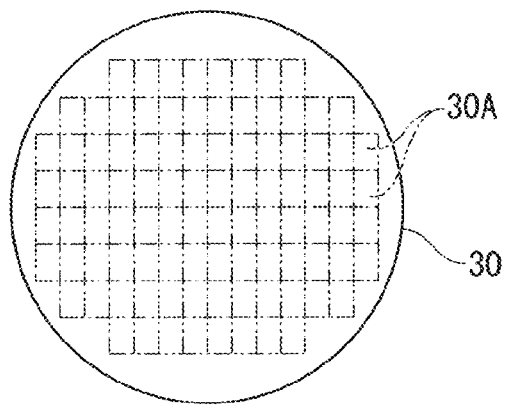
Figure 4C:
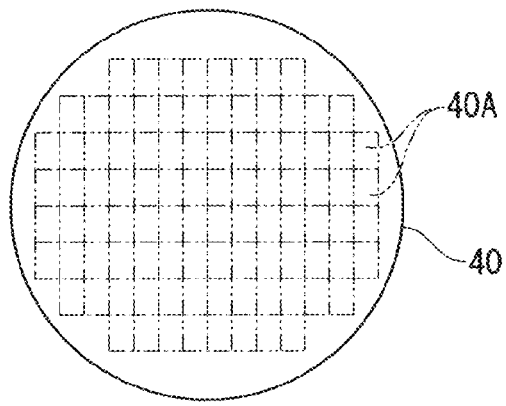

FIGS. 4A through 4C are plan views of first through third wafers 20, 30, and 40 used for the manufacture of the piezoelectric device 1. FIGS. 5A and 5B, FIGS. 6A and 6B, FIGS. 7A and 7B, FIGS. 8A and 8B, and FIGS. 9A and 9B schematically illustrate the steps for manufacturing the piezoelectric device 1. Each of FIGS. 5A through 9B contains both a plan view and a cross-sectional view showing enlarged chip portions.

As illustrated in FIGS. 4A through 4C, the first wafer 20 contains a plurality of chip portions 20A. Each of the chip portions 20A corresponds to the base substrate 2. The second wafer 30 contains a plurality of chip portions 30A. Each of the chip portions 30A corresponds to the oscillator substrate 3. The third wafer 40 contains a plurality of chip portions 40A. Each of the chip portions 40A corresponds to the cap substrate 4. The respective sizes of the chip portions 20A, 30A, and 40A in the main surface direction are substantially uniform. The first wafer 20 and the third wafer 40 may be constituted by wafers made of materials selected from appropriate material examples (such as crystal, glass, and silicon). The second wafer 30 is constituted by a substrate made of piezoelectric material. In this embodiment, each of the first through the third wafers 20, 30, and 40 is constituted by wafers made of crystal.

For manufacturing the piezoelectric device 1, various processes are initially applied to each of the first through the third wafers 20, 30, and 40. Then, the first through the third wafers 20, 30, and 40 are laminated and joined to each other while aligning the respective chip portions 20A, 30A, and 40A. Then, each area containing the chip portions 20A, 30A, and 40A is divided into an individual piece to manufacture the plural piezoelectric devices 1 at a time. Any one of the first through the third wafers 20, 30, and 40 may be initially processed. In the following description, the process for the first wafer 20, the process for the second wafer 30, and the process for the third wafer 40 are explained in this order. The respective processes are applied to the plural chip portions at a time.

As illustrated in FIG. 5A, the cores 211 and 221 and the first resin portion 27 are initially formed on one of the surfaces (referred to as front surface) of the first wafer 20 as the process for the first wafer 20. In this embodiment, photosensitive polyimide resin is used as the materials of the cores 211 and 221 and the first resin portion 27. Polyimide resin is applied to the front surface of the first wafer 20 by application or other methods, and the applied film is exposed and developed to form the cores 211 and 221 and the first resin portion 27 at a time.

The sizes (thicknesses) of the cores 211 and 221 and the first resin portion 27 in the thickness direction of the first wafer 20 are controlled such that the tops of the cores 211 and 221 project from the top of the first resin portion 27. The thicknesses of the cores 211 and 221 and the first resin portion 27 and the cross-sectional shapes of these in the thickness direction can be controlled by half exposure, reflow or other methods.

Then, as illustrated in FIG. 5B, the conductive film 212 is continuously formed on the through electrode 23 and the core 211, and the conductive film 222 is continuously formed on the through electrode 24 and the core 221. Also, the first junction layer 28 is formed on the first resin portion 27. In this embodiment, a film of gold is formed by sputtering, and then a film of titanium is formed on the film of gold as the base by sputtering. Subsequently, the laminate films of gold and titanium are patterned by etching using a resist pattern. By this method, the conductive film 212 for covering the entire area of the core 211 and the conductive film 222 for covering the entire area of the core 221 are formed at a time.

Moreover, a film of gold-tin alloy is formed by plating to produce the first junction layer 28 for covering the entire area of the first resin portion 27. The first junction layer 28 may be formed simultaneously with the formation of the conductive films 212 and 222 by using the same material as that of the conductive films 212 and 222 for forming the first junction layer 28. In this case, the connecting method of the first junction layer 28 and the second junction layer 38 may be changed to surface-activating junction or junction by absorptivity of gold, for example.

Then, a support substrate or the like is affixed to the front surface of the first wafer 20 where the conductive films 212 and 222 are formed, and the thickness of the other surface of the first wafer 20 (referred to as back surface) is reduced with support provided by the support substrate.

Next, as illustrated in FIG. 6A, the through electrodes 23 and 24 penetrating through the first wafer 20 and having conduction with the conductive films 212 and 222 are formed. More specifically, through holes penetrating through the first wafer 20 are formed, and then films of conductive material such as copper and gold are formed within the through holes by plating or other methods to form the through electrodes 23 and 24.

Subsequently, as illustrated in FIG. 6B, the back surface terminals 25 and 26 are formed on the back surface of the chip portion 20A. In this embodiment, a film of titanium tungsten is formed on the back surface by sputtering, and then a film of copper is formed on this film as the base by sputtering. Next, the thickness of the surface layer of the laminate films of titanium tungsten and copper is increased by copper plating, and then the laminate films are patterned to form the back surface terminals 25 and 26.

As the process for the second wafer 30, the substantially C-shaped opening 31 is initially formed on the chip portion 30A to produce the frame 32 on the outside of the opening 31, and the thickness of the area of the chip portion 30A surrounded by the opening 31 is reduced to produce the piezoelectric oscillating piece 33 as illustrated in FIG. 7A.

Then, as illustrated in FIG. 7B, the exciting electrode 36 is continuously formed on the frame 32 and the arm 34 of the piezoelectric oscillating piece 33, and the exciting electrode 37 is continuously formed on the frame 32 and the arm 35 of the piezoelectric oscillating piece 33. In this embodiment, a film of chromium is formed on one of the surfaces of the chip portion 30A by sputtering, and then a film of gold is formed on this film as the base by sputtering. Next, the laminate films of chromium and gold are patterned by etching using a resist pattern to produce the exciting electrodes 36 and 37. A method of forming a film of gold by plating or deposition and then patterning this film may be used other than this forming method, for example.

The second junction layer 38 is formed in the area corresponding to the first junction layer 28, and the third junction layer 39 is formed in the area corresponding to the fourth junction layer 42 to be formed on the third wafer 40. The second junction layer 38 and the third junction layer 39 are formed by plating using the resist pattern described above such that plating can be locally precipitated, by patterning films formed by sputtering or deposition, or by other methods.

In this embodiment, the area where the second junction layer 38 and the third junction layer 39 are formed is exposed, and the area where the plating is not precipitated is covered by the resist pattern. Then, gold-tin alloy is precipitated on the second wafer 30 by plating to form the second junction layer 38 and the third junction layer 39 at a time. The second junction layer 38 and the third junction layer 39 may be formed simultaneously with the formation of the exciting electrodes 36 and 37 by using the same material as that of the exciting electrodes 36 and 37 for forming the second junction layer 38 and the third junction layer 39.

As the process for the third wafer 40, the second resin portion 41 is initially formed as illustrated in FIG. 8A. In this embodiment, the second resin portion 41 is made of photosensitive polyimide resin. Polyimide resin is applied to the front surface of the third wafer 40 by application or other methods, and then the resin film is exposed and developed to form the second resin portion 41.

Next, as illustrated in FIG. 8B, the fourth junction layer 42 is formed on the second resin portion 41. In this embodiment, gold-tin alloy is formed by plating to produce the fourth junction layer 42 covering the entire area of the second resin portion 41.

Figure 9A:
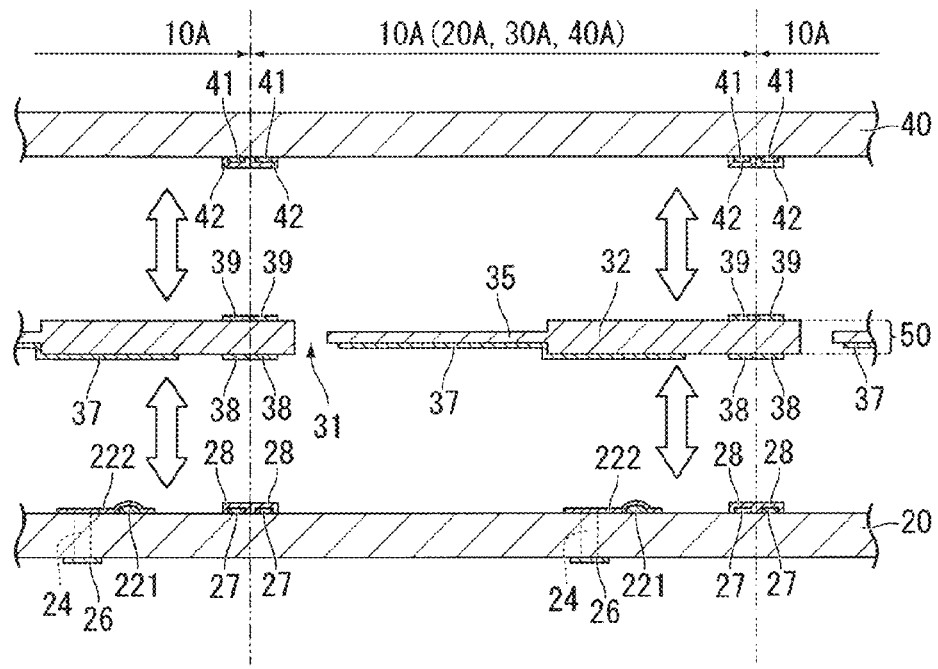
FIG. 9A schematically illustrates a junction step.

After the respective processes for the first through the third wafers 20, 30, and 40 are finished, the first through the third wafers 20, 30, and 40 are aligned such that the positions of the chip portions 20A, 30A, and 40A in the surface direction almost agree with each other as illustrated in FIG. 9A. The area on which the chip portions 20A, 30A, and 40A overlap with each other becomes a chip portion 10A corresponding to the piezoelectric device 1.

Then, the first junction layer 28 and the second junction layer 38 tightly contacting each other are heated and melted to solder the first junction layer 28 and the second junction layer 38. Also, the third junction layer 39 and the fourth junction layer 42 tightly contacting each other are heated and melted to solder the third junction layer 39 and the fourth junction layer 42. By soldering under a reduced pressure atmosphere such as soldering within a vacuum chamber, the piezoelectric oscillating piece 33 is hermetically sealed in the space surrounded by the base substrate 2 and the cap substrate 4 under the condition of the reduced pressure. In this condition, the base substrate 2 and the oscillator substrate 3 are connected to each other with compression of the cores 211 and 221 projecting from the first resin portion 27. The conductive films 212 and 222 are pressed against the terminal portions 360 and 370 of the exciting electrodes 36 and 37 by the resiliency of the cores 211 and 221 and thus are brought into tight contact with the terminal portions 360 and 370.

Examples of the method for connecting the first through the third wafers involve junction methods using hydrogen bonding, metal bonding, and surface-activating junction as well as soldering junction. In case of the junction methods using hydrogen bonding and the surface-activating junction, a metal film only needs to be formed at least on one of the pair of the surfaces to be joined. Thus, the second junction layer 38 and the third junction layer 39 of the oscillator substrate 3 can be eliminated, for example. In this case, the first junction layer 28 corresponds to the first metal film, and the fourth junction layer 42 corresponds to the second metal film.

In case of the junction method using hydrogen bonding, hydroxyl (OH—) is applied to both the surface of the first junction layer 28 and the surface of the second junction layer 38, for example, by ultraviolet ray radiation, oxygen plasma processing or the like. When the surface of the first junction layer 28 and the surface of the second junction layer 38 tightly contact each other, hydroxyls on both the surfaces achieve hydrogen bonding and join the first junction layer 28 and the second junction layer 38. When the second junction layer 38 is eliminated, for example, hydroxyl is applied to the area of the frame 32 corresponding to the first junction layer 28.

In case of the junction method using metal bonding, the first junction layer 28 and the second junction layer 38 are brought into tight contact with each other and heated. The first junction layer 28 and the second junction layer 38 are joined to each other by mutual heat diffusion of metal atoms between the first and second junction layers 28 and 38.

In case of the junction method using surface-activating junction, the surface layer of the first junction layer 28 and the surface layer of the second junction layer 38 are removed by argon sputtering or other methods under a reduced pressure atmosphere to expose binds of metals contained in the first junction layer 28 and the second junction layer 38. Then, the surface of the first junction layer 28 and the surface of the second junction layer 38 are brought into tight contact with each other. As a result, the binds exposed to the surface of the first junction layer 28 are combined with the binds exposed to the surface of the second junction layer 38, allowing the first junction layer 28 and the second junction layer 38 to be joined with each other. When the second junction layer 38 is eliminated, for example, the area of the surface layer of the frame 32 corresponding to the first junction layer 28 is removed. Then, the activated surface containing binds is exposed, and joined to the surface of the first junction layer 28.

Figure 9B:
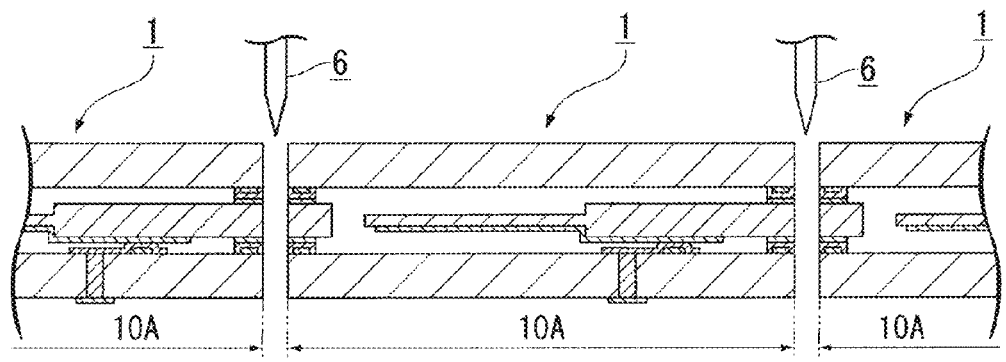
FIG. 9B schematically illustrates a step of division into separate pieces.

Next, the first through the third wafers 20, 30, and laminated and joined to each other are divided into individual pieces of the chip portions 10A by using a dicing cutter 6 or the like to manufacture the plural piezoelectric devices 1 at a time as illustrated in FIG. 9B.

According to the piezoelectric device manufacturing method in the second embodiment, the resin portions and the resin projections are formed. Thus, piezoelectric devices having preferable characteristics can be efficiently manufactured. In this method, the first through the third wafers 20, 30, and 40 containing the plural chip portions are joined and divided into individual pieces after the respective processes are applied to the first through the third wafers 20, 30, and 40. Thus, the plural piezoelectric devices 1 can be manufactured at a time with high efficiency.

According to this method, the base substrate 2 and the frame 32 are connected by the first metal film, and the frame 32 and the cap substrate 4 are connected by the second metal film. Thus, the necessity of using adhesives for connection between the substrates can be reduced. Moreover, since the gap between the base substrate 2 and the frame 32 is controlled by the first resin portion 27, the necessity of using conductive adhesives for electric connection between the exciting electrodes 36 and 37 and the conductive films 212 and 222 can be reduced. Thus, the structure not using adhesives containing organic solvent as in this embodiment can eliminate adverse effects produced by gas from organic solvent.

Accordingly, the piezoelectric device in the embodiment of the invention has preferable shock resistance and oscillation characteristics. Thus, even when shock caused by falling or the like is given to an electronic apparatus including the piezoelectric device, the possibility of damage and malfunction of the piezoelectric device can be considerably reduced, allowing preferable operation of the electronic apparatus. Therefore, when the piezoelectric device according to the embodiment of the invention which is not easily affected by falling or vibration of the electronic apparatus is applied to a mobile body such as a cellular phone, the reliability of the mobile body can improve.

Furthermore, according to the piezoelectric device manufacturing method in the embodiment of the invention, piezoelectric devices having preferable characteristics can be efficiently manufactured.

The technical scope of the invention is not limited to the embodiments described herein. It is therefore intended that various modifications may be made without departing from the scope and spirit of the invention. For example, the resin portion is only required at least either between the base substrate 2 and the oscillator substrate 3 or between the oscillator substrate 3 and the cap substrate 4. Moreover, the first substrate 1 and the third substrate 3 may be modified in the manner described below.

FIG. 10A is a plan view of a base substrate 2B according to a modified example 1, and FIG. 10B is a cross-sectional view taken along a line E-E' in FIG. 10A as viewed in the direction of arrows. As illustrated in FIG. 10A, the base substrate 2B has bump electrodes 22B different from the corresponding components in the first embodiment.

The bump electrodes 22B includes cores (resin projections) 211B, and conductive films 212B and 222B. Each of the cores 211B has a shape produced by dividing a cylindrical shape along a line in the axial direction (semicylindrical shape). The axial direction of the cores 211B extends in the direction along the main surface of the base substrate 2B (Y direction). The conductive films 212B and 222B are separated from each other and disposed in a line in the Y direction. The conductive films 212B and 222B extend from the tops of the cores 211B to the surface of the base substrate 2B in the X direction. The conductive film 212B contacting the through electrode 23 has conduction with the through electrode 23. The conductive film 222B contacting the through electrode 24 has conduction with the through electrode 24.

Figure 11A:
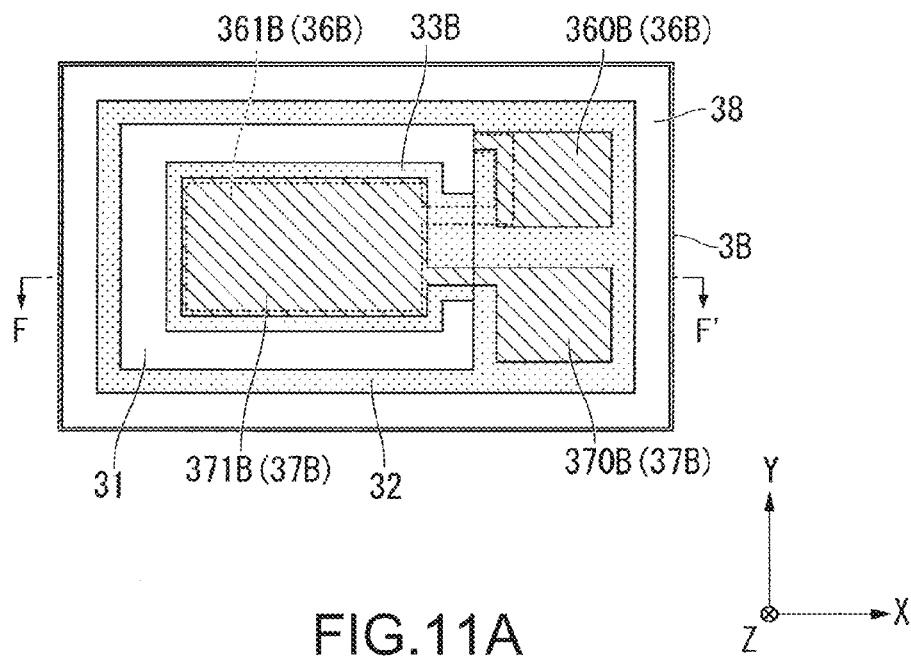
FIGS. 11A and 11B are a plan view and a cross-sectional view of an oscillator substrate in another modified example, respectively.
Figure 11B:
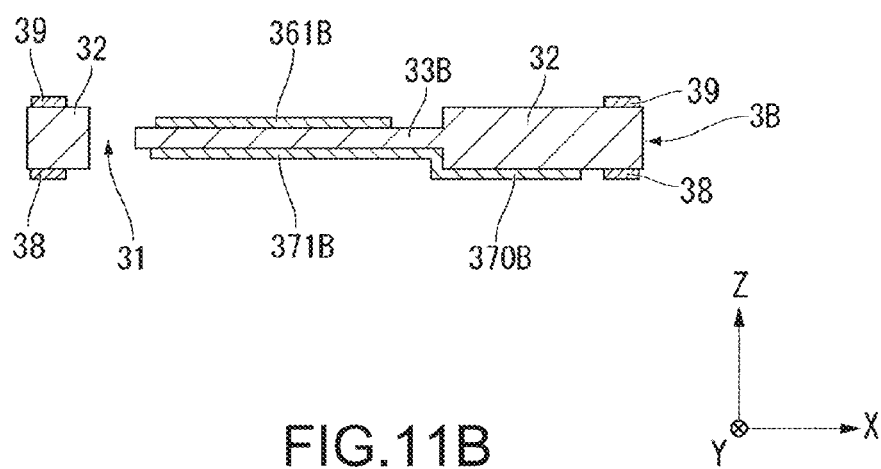

FIG. 11A is a plan view of an oscillator substrate 3B according to a modified example 2. FIG. 11B is a cross-sectional view taken along a line F-F' in FIG. 11A as viewed in the direction of arrows. The oscillator substrate 3B is different from the corresponding component in the first embodiment in that an AT-type piezoelectric oscillating piece 33B is contained. The piezoelectric oscillating piece 33B has a substantially rectangular external shape in the plan view. A terminal portion 360B of an exciting electrode 36B and a terminal portion 370B of an exciting electrode 37B are provided on the surface of the frame 32 on the side connected with the base substrate. The exciting electrode 36B extends along the side wall of the opening 31 to be drawn toward the back side of the surface to be connected. The exciting electrode 36B includes a wiring portion 361B provided on the back surface of the piezoelectric oscillating piece 33B. The wiring portion 361B is formed continuously from the terminal portion 360B. The exciting electrode 37B includes a wiring portion 371B provided on the surface of the frame 32 on the side connected with the base substrate. The wiring portion 371B is formed continuously from the terminal portion 370B. The wiring portions 361B and 371B have substantially rectangular shapes in the plan view, for example, and are disposed opposed to each other with the piezoelectric oscillating piece 33B provided between the wiring portions 361B and 371B.

The entire disclosure of Japanese Patent Application No. 2010-000429, filed Jan. 5, 2010 is expressly incorporated by reference herein.

What is claimed is:

1. A piezoelectric device comprising:
a first substrate;
a second substrate disposed opposite to the first substrate;
a third substrate disposed between the first substrate and the second substrate, a part of the third substrate forming a piezoelectric oscillating piece having a piezoelectric oscillating electrode, and another part of the third substrate forming a frame that surrounds the piezoelectric oscillating piece;
a first metal film that joins the first substrate and the frame;
a second metal film that joins the second substrate and the frame;
a resin portion provided at least at any one of positions between the first substrate and the first metal film, between the frame and the first metal film, between the second substrate and the second metal film, and between the frame and the second metal film, and
a bump electrode that is formed on the first substrate, wherein
the bump electrode has a resin projection projecting toward the third substrate and a bump conductive film covering the resin projection, and
the piezoelectric oscillating electrode is electrically connected with the bump conductive film.

2. The piezoelectric device according to claim 1, wherein
the first metal film is continuously formed throughout the frame in the peripheral direction of the frame;
a through electrode is provided on the area of the first substrate surrounded by the frame in such a manner as to penetrate through the first substrate; and
the through electrode is electrically connected with the piezoelectric oscillating electrode.

3. The piezoelectric device according to claim 1, wherein an entire part of the resin portion is covered by the first metal film or the second metal film.

4. A piezoelectric device manufacturing method for manufacturing a piezoelectric device that includes a first substrate, a second substrate disposed opposite to the first substrate and joined to the first substrate with a third substrate interposed between the first and second substrates, a part of the third substrate forming a piezoelectric oscillating piece having piezoelectric oscillating electrode, and another part of the third substrate forming a frame that surrounds the piezoelectric oscillating piece, comprising:
forming a first metal film disposed between the first substrate and the frame;
forming a second metal film disposed between the second substrate and the frame;
forming a plurality of resin portions at positions between any of the first substrate and the first metal film, the frame and the first metal film, the second substrate and the second metal film, and the frame and the second metal film by using a resin material;
joining the first substrate and the frame by the first metal film;
joining the second substrate and the frame by the second metal film;

forming one of the resin portions on an area of the first substrate that faces the frame, forming a resin projection on the area that corresponds to the piezoelectric oscillating electrode; and forming a bump conductive film, which is electrically connected with the piezoelectric oscillating electrode, on the resin projection to form a bump electrode.

5. The piezoelectric device manufacturing method according to claim 4, wherein the resin projection is formed so as to project from a surface on which one of the resin portions is formed by a projected thickness that is larger than a thickness of another of the resin portions; and a gap between the first substrate and the third substrate is controlled by the resin portions so that the bump conductive film can be pressed against the piezoelectric oscillating electrode by the resin projection for contact between the bump conductive film and the piezoelectric oscillating electrode in the process of joining the first substrate and the frame.

* * * * *